(12) United States Patent
Yoshioka et al.

(10) Patent No.: US 9,006,790 B2
(45) Date of Patent: *Apr. 14, 2015

(54) NITRIDE SEMICONDUCTOR DEVICE

(71) Applicant: Kabushiki Kaisha Toshiba, Tokyo (JP)

(72) Inventors: Akira Yoshioka, Kanagawa (JP);
Wataru Saito, Kanagawa (JP);
Yasunobu Saito, Tokyo (JP); Hidetoshi Fujimoto, Kanagawa (JP); Tetsuya Ohno, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 9 days.

This patent is subject to a terminal disclaimer.

(21) Appl. No.: 13/872,742

(22) Filed: Apr. 29, 2013

(65) Prior Publication Data

US 2013/0240899 A1    Sep. 19, 2013

Related U.S. Application Data

(62) Division of application No. 13/052,881, filed on Mar. 21, 2011, now Pat. No. 8,664,696.

(30) Foreign Application Priority Data

May 6, 2010 (JP) ................. 2010-106399

(51) Int. Cl.
*H01L 29/66* (2006.01)
*H01L 29/20* (2006.01)
(Continued)

(52) U.S. Cl.
CPC ...... *H01L 29/7783* (2013.01); *H01L 21/28264* (2013.01); *H01L 21/743* (2013.01);
(Continued)

(58) Field of Classification Search
CPC ............ H01L 29/7783; H01L 29/7787; H01L 29/2003
USPC ................... 257/76, 194, 200, 201, 288, 411, 257/E21.403, E29.246, E29.255; 438/172
See application file for complete search history.

(56) References Cited

U.S. PATENT DOCUMENTS

| 4,636,823 A | 1/1987 | Margalit et al. |
| 5,506,421 A | 4/1996 | Palmour |

(Continued)

FOREIGN PATENT DOCUMENTS

| JP | 2001358075 A | 12/2001 |
| JP | 2007250955 A | 9/2007 |

(Continued)

OTHER PUBLICATIONS

Chinese Office Action dated May 21, 2014, filed in Chinese counterpart Application No. 201110109142.8, 12 pages (with translation).

(Continued)

*Primary Examiner* — Jarrett Stark
(74) *Attorney, Agent, or Firm* — Patterson & Sheridan, LLP

(57) ABSTRACT

According to one embodiment a nitride semiconductor device includes a first, a second and a third semiconductor layer, a first and a second main electrode and a control electrode. The first layer made of a nitride semiconductor of a first conductivity type is provided on a substrate. The second layer made of a nitride semiconductor of a second conductivity type is provided on the first layer. The third layer made of a nitride semiconductor is provided on the second layer. The first electrode is electrically connected with the second layer. The second electrode is provided at a distance from the first electrode and electrically connected with the second layer. The control electrode is provided within a first trench via an insulating film. The first trench is disposed between the first and the second main electrodes, penetrates the third and the second layers, and reaches the first layer.

20 Claims, 3 Drawing Sheets

(51) Int. Cl.
  *H01L 29/778* (2006.01)
  *H01L 21/28* (2006.01)
  *H01L 21/74* (2006.01)
  *H01L 29/08* (2006.01)
  *H01L 29/417* (2006.01)
  *H01L 29/423* (2006.01)
  *H01L 29/78* (2006.01)

(52) U.S. Cl.
  CPC ........ *H01L29/0847* (2013.01); *H01L 29/2003* (2013.01); *H01L 29/41766* (2013.01); *H01L 29/4236* (2013.01); *H01L 29/7787* (2013.01); *H01L 29/78* (2013.01)

(56) References Cited

U.S. PATENT DOCUMENTS

| | | | |
|---|---|---|---|
| 6,100,549 | A | 8/2000 | Weitzel et al. |
| 7,038,252 | B2 | 5/2006 | Saito et al. |
| 2003/0168704 | A1 | 9/2003 | Harada et al. |
| 2008/0179694 | A1 | 7/2008 | Nakazawa et al. |
| 2009/0050936 | A1 | 2/2009 | Oka |
| 2009/0200576 | A1 | 8/2009 | Saito et al. |
| 2009/0267078 | A1 | 10/2009 | Mishra et al. |
| 2009/0321854 | A1 | 12/2009 | Ohta et al. |
| 2010/0210080 | A1 | 8/2010 | Nomura et al. |
| 2010/0308375 | A1 | 12/2010 | Birkhahn |
| 2011/0068371 | A1 | 3/2011 | Oka |
| 2011/0233538 | A1 | 9/2011 | Iwakami et al. |
| 2012/0319165 | A1 | 12/2012 | Nakayama |

FOREIGN PATENT DOCUMENTS

| | | |
|---|---|---|
| JP | 2008258419 A | 10/2008 |
| JP | 2009170546 A | 7/2009 |

OTHER PUBLICATIONS

Japanese Office Action dated Jan. 29, 2014, filed in Japanese counterpart Application No. 2010-106399, 8 pages (with translation).
Chinese Office Action issued Mar. 19, 2013 in Chinese counterpart Application No. 201110109142.8, 7 pages (with English translation, 9 pages).
H. Kambayashi, "Enhancement-mode GaN Hybrid MOS-HFETs on Si substrates with Over 70 A operation", ISPSD, 4 pages, Jun. 2009.
Chinese Office Action dated Nov. 6, 2013, filed in Chinese counterpart Application No. 201110109142.8, 6 pages (with translation).
Chinese Office Action dated Nov. 14, 2014, filed in Chinese counterpart Application No. 201110109142.8, 8 pages (with translation).

NITRIDE SEMICONDUCTOR DEVICE

CROSS-REFERENCE TO RELATED APPLICATIONS

This application is a divisional of U.S. patent application Ser. No. 13/052,881, filed on Mar. 21, 2011, which is based upon and claims the benefit of priority from the prior Japanese Patent Application No. 2010-106399, filed on May 6, 2010; the entire contents of which are incorporated herein by reference.

FIELD

Embodiments described herein relate generally to a nitride semiconductor device.

BACKGROUND

High breakdown voltage and low resistance characteristics are required for electrical power control devices (power semiconductor devices) used in switching power sources, inverters, and the like. There is a trade-off relationship between the voltage breakdown characteristics and the output characteristics of semiconductor devices that is determined by the properties of the materials of the device. Silicon has been used as a material for power semiconductors to-date. As a result of technical development over many years, a limit is being approached in the high breakdown voltage and low resistance characteristics of power semiconductor devices, and that limit is determined by the material properties of silicon. Therefore, devices using new materials instead of silicon, such as silicon carbide (SIC), nitride semiconductors, and the like, are being developed to overcome this limitation.

For example, it is known that by forming a heterojunction by stacking the nitride semiconductors gallium nitride (GaN) and aluminum gallium nitride (AlGaN), a 2-dimensional electron gas (2DEG) is formed at the interface. This 2DEG has a sheet carrier concentration of not less than $1 \times 10^{13}$ cm$^{-2}$, and a mobility of not less than 1,000 cm$^2$/Vs. A Hetero-Structure Field Effect Transistor (HFET) using this as a channel has high breakdown voltage and low on-resistance, so it has been gaining attention as a device in which maximum characteristics of nitride semiconductors can be displayed.

However, a HFET that uses a 2DEG is a normally-on device in which current flows between the source and domain when no gate voltage is applied. A normally-off device is desirable from the points of view of safety and reducing electrical power consumption. In particular, for power semiconductor devices used for electrical power control, a normally-off device is essential for safety, so a nitride semiconductor device with normally-off properties is desirable.

DETAILED DESCRIPTION

Figure 1:
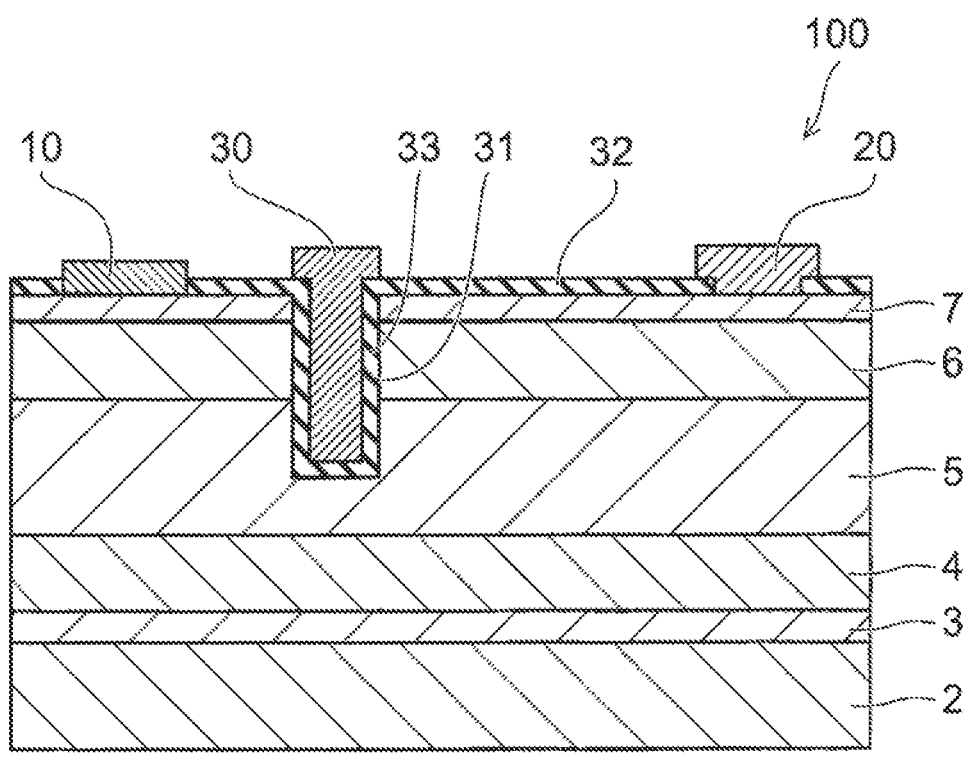
FIG. 1 is a schematic view illustrating a cross-section of a nitride semiconductor device according to a first embodiment.

In general, according to one embodiment, a nitride semiconductor device includes a first semiconductor layer, a second semiconductor layer, a third semiconductor layer, a first main electrode, a second main electrode and a control electrode. The first semiconductor layer made of a nitride semiconductor of a first conductivity type is provided on a substrate. The second semiconductor layer made of a nitride semiconductor of a second conductivity type is provided on the first semiconductor layer and has a sheet carrier concentration being same as a sheet carrier concentration of the first semiconductor layer. The third semiconductor layer made of a nitride semiconductor with a forbidden band width wider than a forbidden band width of the second semiconductor layer is provided on the second semiconductor layer. The first main electrode is electrically connected with the second semiconductor layer. The second main electrode is provided at a distance from the first main electrode and electrically connected with the second semiconductor layer. The control electrode is provided within a first trench via an insulating film. The first trench is disposed between the first main electrode and the second main electrode, penetrates the third semiconductor layer and the second semiconductor layer, and reaches the first semiconductor layer.

Various embodiments will now be described hereinafter with reference to the accompanying drawings. Note that in the following embodiments, the same numerals are applied to constituents that have already appeared in the drawings and, and repetitious detailed descriptions of such constituents are omitted. A first conductivity type is described as being p-type and a second conductivity type is described as being n-type.

First Embodiment

FIG. 1 schematically illustrates a cross-section of a nitride semiconductor device 100 according to a first embodiment.

The nitride semiconductor device 100 includes a p-type GaN layer 5 which is a first semiconductor layer provided on a substrate 2, an n-type GaN layer 6 which is a second semiconductor layer provided on the p-type GaN layer 5, and an n-type AlGaN layer 7 which is a third semiconductor layer provided on the n-type GaN layer 6.

A sheet carrier concentration of the p-type GaN layer 5 which is the first semiconductor layer and a sheet carrier concentration of the n-type GaN layer 6 which is the second semiconductor layer are virtually the same.

Here, the sheet carrier concentrations being the same do not mean strictly equal. For example, this refers to a state in which, when the p-type GaN layer 5 and the n-type GaN layer 6 are depleted, the minus charge of the p-type GaN layer 5 cancels out the plus charge of the n-type GaN layer 6, and is regarded as a pseudo low concentration layer.

The forbidden band width of the third semiconductor layer is wider than that of the second semiconductor layer. For example, when the second semiconductor layer is a GaN layer, an AlGaN layer, an InAlN layer, or the like, can be used as the third semiconductor layer.

In addition, a source electrode 10 which is a first main electrode and a drain electrode 20 which is a second main electrode are provided separated from each other on the n-type AlGaN layer 7 which is the third semiconductor layer.

The source electrode 10 and the drain electrode 20 are in electrical connection with the n-type GaN layer 6.

A first trench that penetrates the n-type AlGaN layer 7 and the n-type GaN layer 6 and reaches the p-type GaN layer 5 is provided between the source electrode 10 and the drain electrode 20.

The first trench is the trench 31 illustrated in FIG. 1, and a date electrode 30 which is a control electrode is provided within the trench 31 via a gate insulating film 33.

In the nitride semiconductor device 100 according to the embodiment, in a state when, for example, the source electrode 10 is grounded and a positive voltage is applied to the drain electrode 20, the drain current flowing between the drain electrode 20 and the source electrode 10 is controlled by applying a gate voltage to the gate electrode 30.

As illustrated in FIG. 1, the type GaN layer 6, which is a channel layer through which the drain current flows, is divided by the trench 31 provided between the drain electrode 20 and the source electrode 10. In addition, when the source electrode 10 is grounded and a positive voltage is applied to the drain electrode 20, a pn junction between the p-type GaN layer 5 and the n-type GaN layer 6 is reverse biased between the gate and the drain, so current does not flow.

Therefore, by applying a positive gate voltage to the gate electrode 30 and forming an inversion channel at the interface between the p-type GaN layer 5 and the gate insulating film 33, drain current can flow from the drain electrode 20 to the source electrode 10. In other words, in the nitride semiconductor device 100 according to the embodiment, a normally-off operation is achieved.

Several methods are known to make a normally-off HFET using nitride semiconductors as the material. For example, there is the method of forming a so-called recess structure, in which a barrier layer below the gate electrode is etched to form a to thin film. However, the threshold voltage of a normally-off configured HFET using this method is not much higher than 0 V, so it is not practical as a normally-off device. In particular, in a transistor used for electrical power control, a margin is necessary for the safety of the circuit, so a threshold voltage of +3 V is required.

Therefore, in a HFET using an AlGaN/GaN type heterostructure, completely removing the AlGaN layer below the gate electrode by etching to provide a device structure in which a 2-dimensional electron gas (2DEG) at the interface of the AlGaN/GaN is divided has been investigated. These device structures are referred to as hybrid structures because drain current is controlled by the channel at the interface of the gate insulating film and the GaN layer while the 2DEG at the interface of the AlGaN/GaN between the gate and the drain and between the source and the gate is activated.

One advantage of this hybrid structure is that it is possible to increase the threshold voltage compared to a recess structure. Another advantage is that variation in the threshold voltage is small compared to a recess structure, in which the threshold voltage is adjusted by the film thickness of the AlGaN layer. However, as long as a configuration is adopted in which the channel between the n-type GaN and the gate insulating film is controlled by the gate voltage, there is the problem that it is difficult to obtain a threshold voltage that is not less than +3 V.

Therefore, a device structure that uses, for example, an inversion channel between the p-type GaN layer and the gate insulating film has been investigated. It has been confirmed that the threshold voltage of these HFET is improved, and much is expected from them in the future, but on the other hand, there are concerns over degradation of the characteristics due to the p-type GaN layer.

One concern is a reduction in breakdown voltage between the gate and the drain due to providing the p-type GaN layer on a high resistance buffer layer. In addition, there is concern over reduction in the 2DEG due to diffusion of Mg from the p-type GaN layer to the channel layer (n-type GaN layer), and the built in potential of the p-n junction formed between the p-type GaN layer and the n-type GaN layer, in other words, concern over high resistance at AlGaN/GaN interfaces. Also, high resistance of the channel layer (n-type GaN layer) caused by the degraded crystal quality of the p-type GaN layer is a concern.

In contrast, the nitride semiconductor device 100 according to the embodiment has a configuration in which charge balance is ensured by having the sheet carrier concentration of the p-type GaN layer 5 and the sheet carrier concentration of the n-type GaN layer 6 virtually the same, so the breakdown voltage between the gate and the drain is improved. In this way a high breakdown voltage can be maintained, even if the p-type GaN layer 5 is added.

In addition, by increasing the concentration of n-type impurities of the channel layer (n-type GaN layer) and increasing the film thickness, the effects of Mg diffusion and the built in potential at the p-n junction are mitigated. In this way, it is possible to achieve a nitride semiconductor device with improved threshold voltage while maintaining a low on-resistance and high breakdown voltage.

The following is a detailed description of the nitride semiconductor device 100 according to the first embodiment.

In the nitride semiconductor device 100 illustrated in FIG. 1, a buffer layer 3 made from a nitride semiconductor layer, an undoped GaN layer 4 (a sixth semiconductor layer), the p-type GaN layer 5, the n-type GaN layer 6, and the undoped AlGaN layer 7 can be deposited subsequently on the sap lire substrate 2 by, for example, a Metal Organic Chemical Vapor Deposition (MOCVD) method.

A SIC substrate, a Si substrate, a GaN substrate, or the like, may be used instead of the sapphire substrate as the substrate 2.

The undoped GaN layer 4 is a high resistance layer with low carrier concentration, and the conductivity type may be either n-type or p-type. A thickness of the undoped GaN layer 4 can be about 2 μm.

Undoped means that intentional doping with n-type impurities or p-type impurities has not been carried out. When GaN is grown using the MOCVD method, it displays n-type conductivity even though it is undoped, but the electron concentration is low and the resistance is high. Also, instead of the GaN layer, a multi-layer structure of stacked undoped nitride semiconductors with mutually differing compositions can be used.

A thickness of the p-type GaN layer 5 which is the first semiconductor layer is about 0.5 μm, and it can be doped with the p-type impurity Mg.

A thickness of the n-type GaN layer 6 which is the second semiconductor layer is about 0.5 μm, and it can be doped with the n-type impurity Si.

The sheet carrier concentrations of the p-type GaN layer 5 and the n-type GaN layer 6 are virtually the same. For example, if the thicknesses are the same, the hole concentration of the p-type GaN layer 5 and the electron concentration of the n-type GaN layer 6 can be each about $1 \times 10^{16}$ cm$^{-3}$.

A thickness of the undoped AlGaN layer 7, which is the third semiconductor layer, is about 30 nm, and the Al content can be out 25%. The undoped AlGaN layer 7 has n-type conductivity, the same as the undoped GaN layer 4.

The source electrode 10 and the drain electrode 20 having Al/Ti stacked structure are provided separated from each other on the undoped AlGaN layer 7. The Al/Ti stacked structure is formed so that a Ti layer is in contact with the undoped AlGaN layer 7.

The trench 31 is provided between the source electrode 10 and the drain electrode 20. The trench 31 can be formed by etching the AlGaN layer and the GaN layer by a reactive ion etching (RIE) method using a chlorine-based etching gas, for example.

A depth of the trench 31 is about 0.75 μm, and can be provided penetrating the undoped AlGaN layer 7 and the n-type GaN layer 6 and reaching the p-type GaN layer 5. Also, a width of the trench 31, which corresponds to the gate length in the direction from the source electrode 10 to the drain electrode 20, can be about 1 μm.

The gate insulating film 33 is provided on the inside surface of the trench 31 covering the side walls and the bottom surface. Additionally, the gate electrode 30 made from p-type polysilicon is provided embedded within the trench 31.

A surface protection film 32 that is provided on the surfaces of the gate insulating film 33 and the undoped AlGaN layer 7 can be formed at the same time. For example, a silicon nitride film (SiN film) about 30 nm thick formed by an atomic layer deposition (ALD) method can be used.

Next, the operation of the nitride semiconductor device 100 is explained.

In the nitride semiconductor device 100, a 2DEG is generated at the AlGaN/GaN interface between the source and the gate and between the gate and the drain, and a low on-resistance is obtained as a result of the drain current flowing via this 2DEG.

In addition, in the nitride semiconductor device 100, the n-type GaN layer 6, which is the channel layer, is doped with n-type impurities so a low resistance is obtained. In this way, when the transistor is in the on state, the n-type GaN layer 6 also contributes to the conductivity in addition to the 2DEG at the AlGaN/GaN interface, so it is possible to further reduce the on-resistance compared to when undoped GaN is used.

Also, by increasing the impurity concentration of the n-type GaN layer 6, it is possible to reduce the effect of the built in potential between the p-type GaN layer 5 and the n-type GaN layer 6. In this way, it is possible to prevent a reduction in the electron density in the 2DEG at the interface of the AlGaN/GaN, and the result is a low on-resistance.

In addition, by making the n-type GaN layer 6 a thin film, diffusion of Mg after growing the p-type GaN layer 5 and the quantity of Mg contained near the AlGaN/GaN interface is reduced due to the so-called memory effect. In this way, it is possible to prevent a reduction in the electron density in the 2DEG, and the low on-resistance can be maintained.

On the other hand, in the side walls of the trench 31 in which the gate electrode 30 is embedded, a portion where the n-type GaN layer 6 and the gate insulating film 33 contact functions as a channel that connects the 2DEG at the interface of the AlGaN/GaN and the inversion layer formed at the interface of the p-type GaN layer 5 and the gate insulating film 33. Therefore, making the n-type GaN layer 6 a thin film has the problem that the effective gate length of the gate electrode 30 is lengthened.

For example, as stated previously, the width of the trench 31 in a gate length direction is about 1 μm. On the other hand, the thickness of the n-type GaN layer 6 is about 0.5 μm, and the length of the channel formed at the interface of the n-type GaN layer 6 and the gate insulating film 33 on the side walls of the trench 31 is 1 μm including both the source side and the drain side. In other words, with the effective gate length, which is the length of the channel formed between the gate electrode 30 and the p-type GaN layer 5 and the n-type GaN layer 6 via the gate insulating film 33, the contribution of the thickness of the n-type GaN layer 6 cannot be ignored.

Therefore, by increasing the thickness of the n-type GaN layer 6 the effective gate length of the gate electrode 30 is increased, and the channel resistance is increased. In contrast, as demonstrated in the embodiment, if the n-type GaN layer 6 is doped with the n-type impurity Si, the channel resistance is reduced, and the on-resistance can be reduced. In other words it is possible to increase the film thickness of the n-type GaN layer 6 without increasing the on-resistance, and also possible to prevent the reduction in the electron density of the 2DEG at the interface of the AlGaN/GaN due to Mg.

On the other hand, in the embodiment, the sheet carrier concentration of the n-type GaN layer 6 is provided to be about the same as the sheet carrier concentration of the p-type GaN layer 5. In this way, when the transistor is in the off state, the ionized donors of the n-type GaN layer 6 and the ionized acceptors of the p-type GaN layer 5 cancel each other out, a pseudo low carrier concentration region is formed, and the electric field distribution in the lateral direction between the gate and the drain becomes uniform. Therefore, it is possible to minimize the reduction in breakdown voltage between the gate and the drain by providing the p-type GaN layer 5.

In addition, to control the threshold voltage, the carrier concentration of the p-type GaN layer 5 can be changed as desired. In other words, if the sheet carrier concentration of the n-type GaN layer 6 and the sheet carrier concentration of the p-type GaN layer 5 are changed so as to be the same, the impurity concentration of the p-type GaN layer 5 can be changed to control the threshold voltage without reducing the breakdown voltage between the gate and the drain. In other words, by balancing the sheet carrier concentration of the p-type GaN layer 5 and the n-type GaN layer 6, it is possible to increase the freedom of design of the threshold without reducing the breakdown voltage of the device.

The electric field distribution within the depletion layer between the gate and the drain changes in accordance with the degree of balance between the sheet carrier concentration of the p-type GaN layer 5 and the sheet carrier concentration of the n-type GaN layer 6, so the breakdown voltage between the gate and the drain also varies. Therefore, the sheet carrier concentration between the p-type GaN layer 5 and the n-type GaN layer 6 need only be the same to the extent that it is possible to ensure the breakdown voltage between the gate and the drain that is required in accordance with the use of the device. For example, if the device is for controlling electrical power, preferably the difference in sheet carrier concentration between the p-type GaN layer 5 and the n-type GaN layer 6 is not more than 10%.

In the embodiment, an example has been given in which the first semiconductor layer is the p-type GaN layer 5 but the first semiconductor layer can include a structure in which nitride semiconductors with different compositions are stacked. Also, as explained in the example of the following embodiment, the second semiconductor layer and the third semiconductor layer can also include a structure in which nitride semiconductors with different compositions are stacked.

Figure 2:
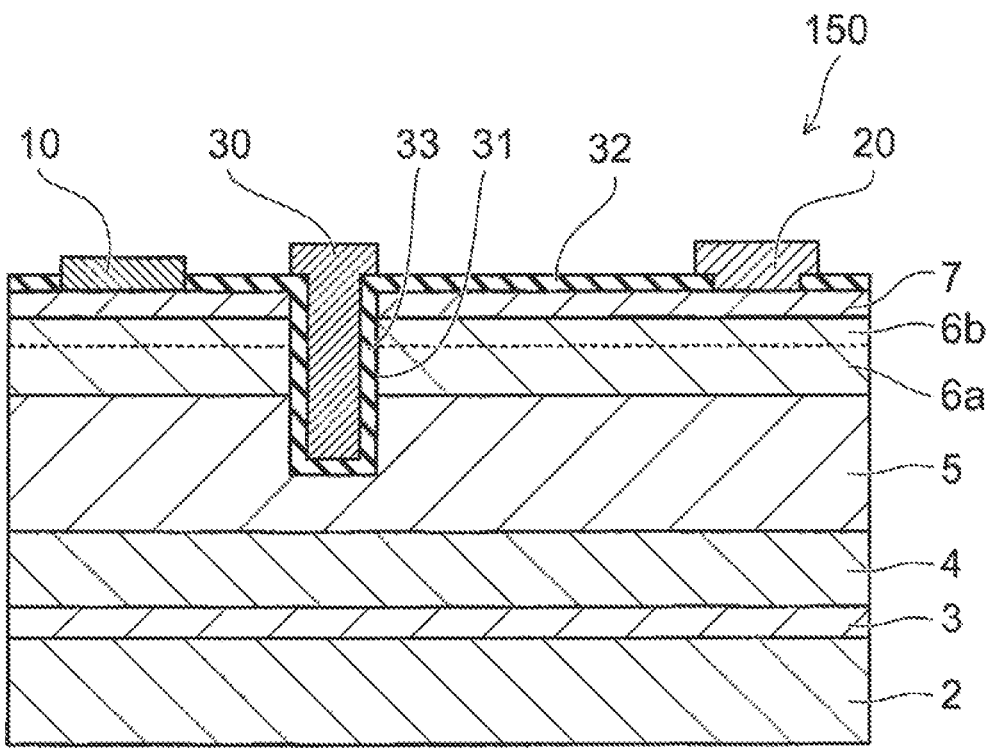
FIG. 2 is a schematic view illustrating a cross-section of a nitride semiconductor device according to a variation of the first embodiment.

FIG. 2 is a schematic view illustrating a cross-section of a nitride semiconductor device 150 according to a variation of the first embodiment.

The nitride semiconductor device 150 according to the variation differs from the nitride semiconductor device 100 in that the second semiconductor layer includes a fourth semiconductor layer that is doped with n-type impurities and a fifth semiconductor layer in contact with the third semiconductor layer and having a concentration of n-type impurities lower than that of the fourth semiconductor layer.

Specifically, the nitride semiconductor device 150 includes an n-type GaN layer 6a which is the fourth semiconductor layer, and an undoped GaN layer 6b which is the fifth semiconductor layer. The n-type GaN layer 6a is provided on the p-type GaN layer 5, and is doped with n-type impurities. The undoped GaN layer 6b is provided on the n-type GaN layer 6a and is in contact with the undoped AlGaN layer 7.

In the nitride semiconductor device 100 as illustrated in FIG. 1, a 2DEG is generated at the interface between the undoped AlGaN layer 7 and the n-type GaN layer 6. On the other hand, in the nitride semiconductor device 150 according to the variation, a 2DEG is generated at the interface between the undoped AlGaN layer 7 and the undoped GaN layer 6b.

In comparison between the n-type GaN layer 6 that is doped with n-type impurities and the undoped GaN layer 6a, for example, there is a difference in depth of the Fermi level when viewed from the conduction band; the Fermi level of the n-type GaN layer 6 is shallower than the Fermi level of the undoped GaN layer 6a. Therefore, a depth of a potential well formed at the interface of the AlGaN/GaN is deeper at the interface of the undoped GaN layer 6b and the undoped AlGaN layer 7 than at the interface of the n-type GaN layer 6 and the undoped AlGaN layer 7.

The electron density of the 2DEG generated at the interface between the undoped GaN layer 6b and the undoped AlGaN layer 7 is higher than the electron density of the 2DEG generated between the n-type GaN layer 6 and the undoped AlGaN layer 7 in accordance with the depth of the potential well. Therefore, in the nitride semiconductor device 150 according to the variation, the electron density of the 2DEG formed at the interface of the AlGaN/GaN is higher than that of the nitride semiconductor device 100, so it is possible to reduce the on-resistance.

In the above variation, the second semiconductor layer is configured from the n-type GaN layer 6a and the undoped GaN layer 6b, but it can also be a stacked structure of semiconductors with mutually differing compositions. For example, the n-type GaN layer 6a may be replaced by an n-type AlGaN layer.

Second Embodiment

Figure 3:
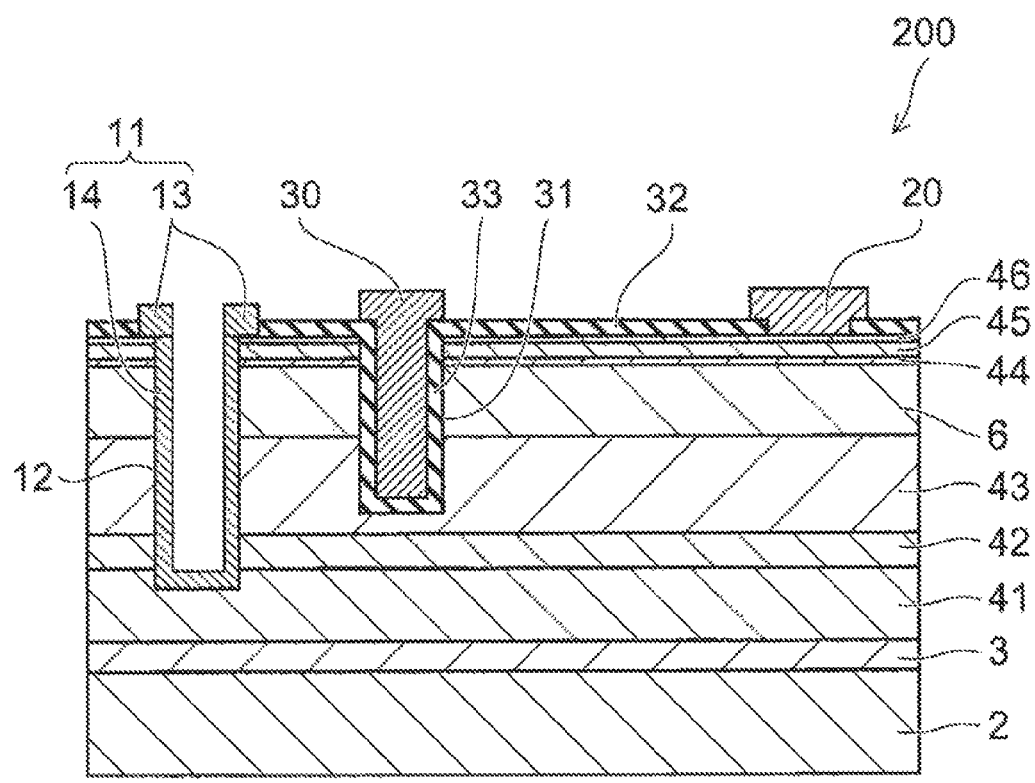
FIG. 3 is a schematic view illustrating a cross-section of a nitride semiconductor device according to a second embodiment.

FIG. 3 is a schematic view illustrating a cross-section of nitride semiconductor device 200 according to a second embodiment.

In the nitride semiconductor device 200 according to the embodiment, the first main electrode is provided within a second trench that penetrates the third semiconductor layer and the second semiconductor layer and reaches the first semiconductor layer, and the interior surface of the second trench is in contact with the first semiconductor layer.

In addition, the third semiconductor layer includes a plurality of semiconductor layers with mutually differing compositions, and the forbidden band width of the semiconductor layer in contact with the second semiconductor layer is wider than that of the second semiconductor layer.

The following is a detailed description with reference to FIG. 3.

In the nitride semiconductor device 200 according to the embodiment, a buffer layer 3, an undoped AlGaN layer 41, a p-type AlGaN layer 42, a p-type GaN layer 43, and an n-type GaN layer 6 are stacked on a substrate 2, and in addition, an undoped AlN layer 44, an n-type AlGaN layer 45, and an n-type GaN layer 46 are subsequently stacked.

The undoped AlGaN layer 41 is a high resistance layer having n-type conductivity, and a thickness thereof can be about 2 μm.

The first semiconductor layer is configured from the p-type AlGaN layer 42 and the p-type GaN layer 43. The p-type AlGaN layer 42 has a thickness of about 0.1 μm and can be doped with the p-type impurity Mg. The p-type GaN layer 43 has a thickness of about 0.4 μm and can be doped with Mg.

A thickness of the n-type GaN layer 6, which is the second semiconductor layer, is about 1 μm, and it can be doped with Si.

For example, by making the carrier concentrations of the p-type AlGaN layer 42 and the p-type GaN layer 43 about $1\times10^{16}$ cm$^{-3}$, and the carrier concentration of the n-type GaN layer 6 about $5\times10^{15}$ cm$^{-3}$, the sheet carrier concentration of the first semiconductor layer and the sheet carrier concentration of the second semiconductor layer can be made to be virtually the same.

The third semiconductor layer can have a structure in which the undoped AlN layer 44, the n-type AlGaN layer 45 with an Al content of 25%, and the n-type GaN layer 46 are subsequently stacked.

The undoped AlN layer 44 is provided on the n-type GaN layer 6, and has a forbidden band width that is wider than that of the n-type GaN layer 6.

A thickness of the undoped AlN layer 44 can be about 2 nm, a thickness of the n-type AlGaN layer 45 can be about 30 nm, and a thickness of the n-type GaN layer 46 can be about 5 nm.

The n-type AlGaN Payer 45 and the n-type GaN layer 46 can be doped with the n-type impurity Si. For example, the carrier concentration of the n-type AlGaN layer 45 may be $2\times10^{11}$ cm$^{-3}$ and the carrier concentration of the n-type GaN layer 46 may be from 2 to $3\times10^{17}$ cm$^{-3}$.

The gate electrode 30 is embedded within the trench 31 that is provided between the source electrode 11 and the drain electrode 20, the same as in the nitride semiconductor device 100 illustrated in FIG. 1. The depth of the trench 31 from the surface of the n-type GaN layer 46 to the p-type GaN layer 43 can be about 1.2 μm. In addition, a width in the gate length direction from the source electrode 11 towards the drain electrode 20 can be about 1.5 μm.

The source electrode 11, which is the first main electrode, is provided extending within a trench 12, which is the second trench, from the surface of the n-type GaN layer 46 and reaching the undoped AlGaN layer 41. As illustrated in FIG. 3, the source electrode 11 is constituted from two ohmic electrodes 13 and 14 in order to form low resistance ohmic contact with each of the p-type GaN layer 43, the p-type AlGaN layer 42, and the n-type GaN layer 6.

The ohmic electrode 14 (first ohmic electrode) which has a Ni/Ag stacked structure, is provided on the side walls and the bottom surface of the trench 12. The ohmic electrode 14 contacts the p-type AlGaN layer 42 and the p-type GaN layer 43 which are exposed on the side walls of the trench 12.

In addition, the ohmic electrode 13 (second ohmic electrode), which has an Al/Ti stacked structure, is provided on a peripheral edge portion of the trench 12. The Ti layer of the ohmic electrode 13 is provided so as to be in contact with the n-type GaN layer 46.

In the nitride semiconductor device 200, the trench 12 is provided from the surface of the n-type GaN layer 46 and reaches to the undoped AlGaN layer 41, but it may be provided reaching to the p-type AlGaN layer 42 or the p-type GaN layer 43.

On the other hand, the drain electrode 20 is provided at a distance from the source electrode 11 so as to sandwich the gate electrode 30. The drain electrode 20 also has an Al/Ti stacked structure, and the Ti layer is provided so as to be in contact with the n-type GaN layer 46.

In the nitride semiconductor device 200 according to the embodiment, it is possible to maintain a low on-resistance and high breakdown voltage and improve the controllability of the threshold voltage, similar to the nitride semiconductor device according to the first embodiment.

In addition, in the source electrode 11, by providing the ohmic electrode 14 in direct contact with the p-type AlGaN layer 42 and the p-type GaN layer 43, it is possible to fix the potential of the p-type AlGaN layer 42 and the p-type GaN layer 43. In this way, it is possible to minimize variations in the threshold voltage, so it is possible to improve stability when performing switching operations.

Third Embodiment

Figure 4:
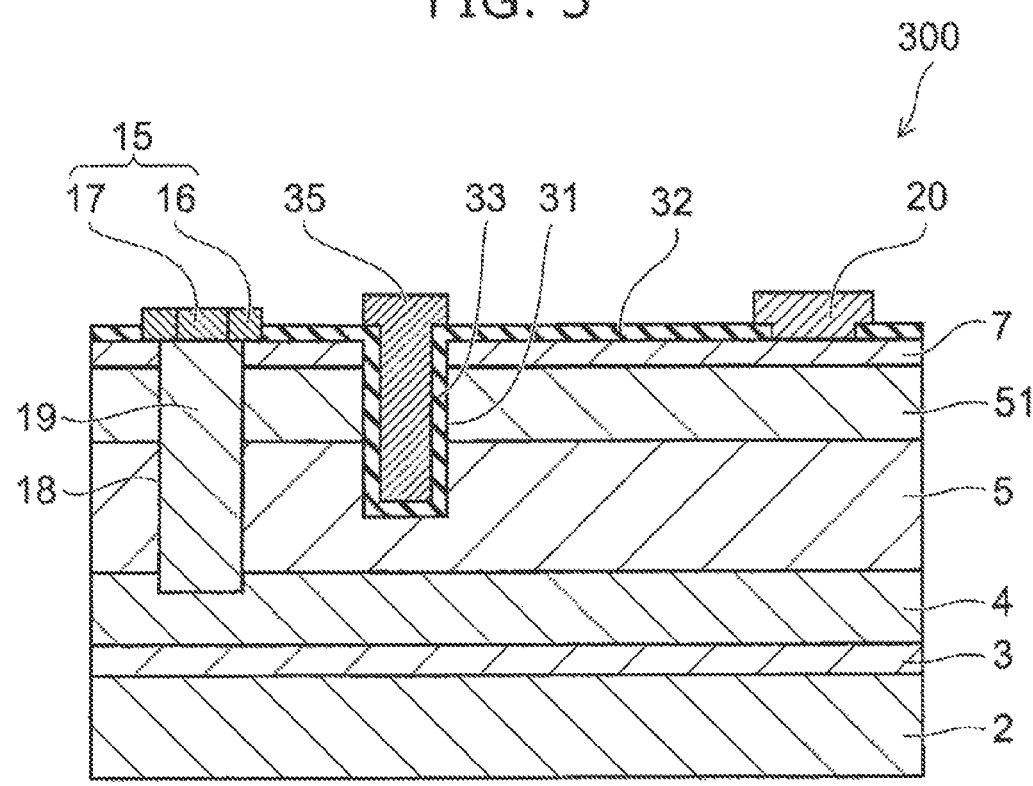
FIG. 4 is a schematic view illustrating a cross-section of a nitride semiconductor device according to a third embodiment.

FIG. 4 is a schematic view illustrating a cross-section of a nitride semiconductor device 300 according to a third embodiment.

In the nitride semiconductor device 300 according to the embodiment, a p-type semiconductor region is provided directly below the first main electrode that penetrates the third semiconductor layer and the second semiconductor layer and reaches to the first semiconductor layer.

The following is a detailed description with reference to FIG. 4.

In the nitride semiconductor device 300 according to the embodiment, a buffer layer 3 made from a nitride semiconductor layer, an undoped GaN layer 4, a p-type GaN layer 5, an n-type InGaN layer 51, and an undoped AlGaN layer 7 are subsequently stacked on a substrate 2.

The undoped GaN layer 4 can be a high resistance layer with a thickness of about 2 μm.

The p-type GaN layer 5, which is a first semiconductor layer, has a thickness of about 0.5 μm, and can be doped with the p-type impurity Mg to a carrier concentration of about $1 \times 10^{15}$ on $cm^{-3}$.

The n-type InGaN layer 51, which is a second semiconductor layer, can have an In content of about 1%, and a thickness of about 0.5 μm. The carrier concentration can be set to about $1 \times 10^{16}$ $cm^{-3}$ by doping with the n-type impurity Si, the same as with the p-type GaN layer 5.

A thickness of the undoped AlGaN layer 7, which is a third semiconductor layer, is about 30 nm, and an Al content thereof can be about 25%.

A gate electrode 35 is embedded within a trench 31 that is provided between a source electrode 15 and a drain electrode 20.

A depth of the trench 31 from the surface of the undoped AlGaN layer 7 to the p-type GaN layer 5 can be about 0.75 μm. In addition, a width in the gate length direction from the source electrode 11 towards the drain electrode 20 can be about 1 μm.

The gate electrode 35 has an Au/Ni layered structure, and can be provided embedded within the trench 31 via the gate insulating film 33.

A p-type GaN region 19, which is a p-type semiconductor region, is provided directly below the source electrode 15, which is the first main electrode. The p-type GaN region 19 is provided with a depth from the surface of the undoped AlGaN layer 7 that reaches to the undoped GaN layer 4.

A carrier concentration of the p-type GaN region 19 is higher than that of the p-type GaN layer 5, for example, can be $1 \times 10^{17}$ to $1 \times 10^{19}$ $cm^{-3}$.

The p-type GaN region 19 can be formed, for example, by embedding p-type GaN within a trench 18 that penetrates from the surface of the undoped AlGaN layer 7 through the undoped AlGaN layer 7, the n-type InGaN layer 51, and the p-type GaN layer 5, and reaches the undoped GaN layer 4. The p-type GaN region 19 may also be formed by ion implantation.

The p-type GaN region 19 need not reach the undoped GaN layer 4, provided it has a depth that reaches the p-type GaN layer 5.

The source electrode 15 is provided so as to be in contact with the p-type GaN region 19 and the undoped AlGaN layer 7.

As illustrated in FIG. 4, the source electrode 15 is constituted from two ohmic electrodes 16 and 17. The ohmic electrode 17 (first ohmic electrode) is provided on the p-type GaN region 19, and can include a Ni/Ag stacked structure with, for example, the Ni layer in contact with the p-type GaN region 19. On the other hand, the ohmic electrode 16 (second ohmic electrode) is provided on the peripheral edge portion of the trench 18, and can include a Ti/Al stacked structure with the Ti layer in contact with the undoped AlGaN layer 7.

The nitride semiconductor device 300 according to the embodiment can maintain low on-resistance and high breakdown voltage and improved controllability of threshold voltage, by doping the n-type InGaN layer 51, which is the second semiconductor layer, with n-type impurities.

In addition, by connecting the p-type GaN layer 5 and the source electrode 15 via the p-type GaN region 19 provided directly below the source electrode 15, it is possible to fix the potential of the p-type GaN layer. In this way, it is possible to improve stability when performing transistor switching operations.

As stated previously, the carrier concentration of the p-type GaN region 19 is higher than the carrier concentration of the p-type GaN layer 5. In this way, the resistance of the p-type GaN region 19 can be reduced, and in addition, contact resistance between the p-type GaN region 19 and the ohmic electrode 17 can be reduced. Therefore, it is possible to reduce the potential difference between the source electrode 15 and the p-type GaN layer 5, and stabilize the potential of the p-type GaN layer 5.

Figure 5:
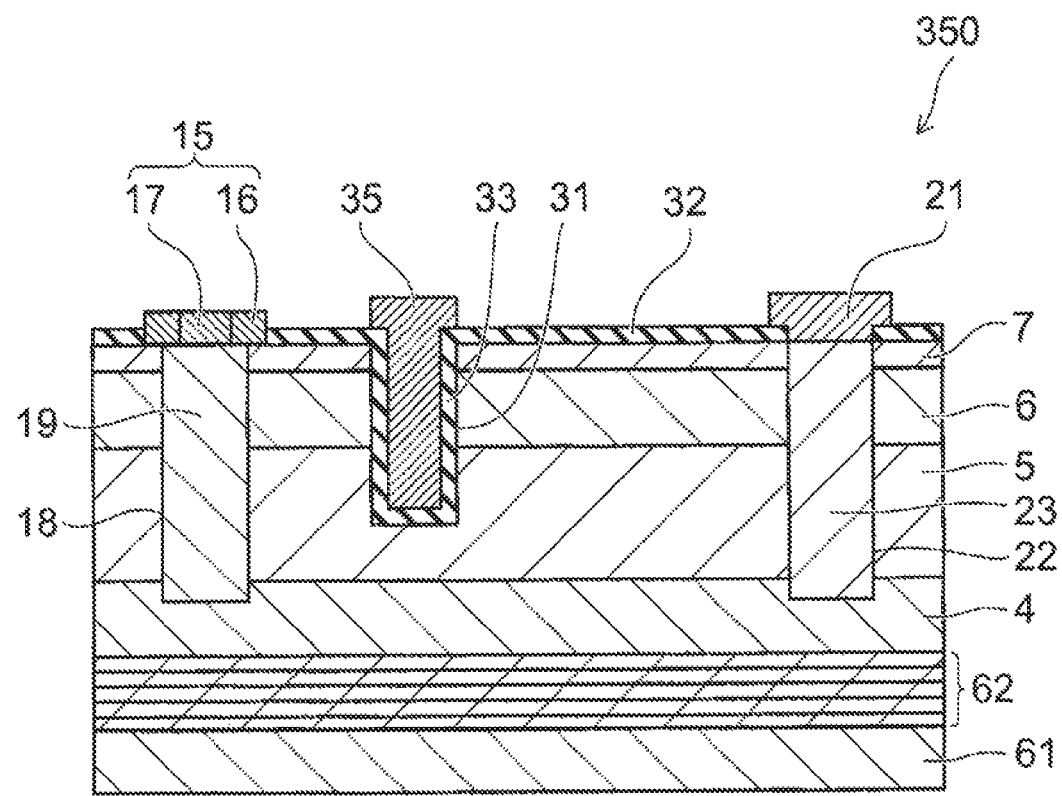
FIG. 5 is a schematic view illustrating a cross-section of a nitride semiconductor device according to a variation of the third embodiment.

FIG. 5 is a schematic view illustrating a cross-section of a nitride semiconductor device 350 according to a variation of the third embodiment.

In the nitride semiconductor device according to the variation, an n-type semiconductor region is provided directly as below the second main electrode that penetrates the third semiconductor layer and the second semiconductor layer and reaches to the first semiconductor layer.

The following is a detailed description with reference to FIG. 5.

In the nitride semiconductor device 350, a stacked buffer layer 62 made from a plurality of nitride semiconductor layers, an undoped GaN layer 4, a p-type GaN layer 5, an n-type GaN layer 6, and an undoped AlGaN layer 7 are subsequently stacked on a Si substrate 61.

Instead of the Si substrate 61, for example, a sapphire substrate, a SIC substrate, a GaN substrate, or the like, can be used.

The undoped GaN layer 4 is a high resistance layer with a thickness of about 2 μm.

The p-type GaN layer 5, which is the first semiconductor layer, has a thickness of about 0.5 μm, and can be doped with the p-type impurity Mg to a carrier concentration of $1 \times 10^{16}$ $cm^{-3}$.

The n-type GaN layer, which is the second semiconductor layer, has a thickness of 0.5 μm, and can be doped with the n-type impurity Si to a carrier concentration of $1 \times 10^{16}$ $cm^{-3}$, which is the same as that of the p-type GaN layer 5.

A thickness of the undoped AlGaN layer 7, which is the third semiconductor layer, can be 30 nm, and the Al content is about 25%.

A gate electrode 35 is embedded within a trench 31 that is provided between a source electrode 15 and a drain electrode 21, the same as in the nitride semiconductor device 300.

In addition, a p-type GaN region 19 is provided directly below the source electrode 15 reaching from the surface of the undoped AlGaN layer 7 to the undoped GaN layer 4. Also, the source electrode 15 is constituted from an ohmic electrode 17 in contact with the p-type GaN region 19, and an ohmic electrode 16 in contact with the undoped AlGaN layer 7.

On the other hand, in the variation, an n-type GaN region 23 is also provided directly below the drain electrode 21, which is a second main electrode, and reaches from the surface of the undoped AlGaN layer 7 to the undoped GaN layer 4.

The drain electrode 21 has a Ti/Al stacked structure that includes a Ti layer in contact with the n-type GaN region 21.

The n-type GaN region 23, for example, can be formed by embedding n-type GaN within a trench 22 that penetrates from the surface of the undoped AlGaN layer 7 through the undoped AlGaN layer 7, the n-type InGaN layer 51, and the p-type GaN layer 5, and reaches the undoped GaN layer 4. The n-type GaN region 23 may also be formed by ion implantation.

The n-type GaN region 23 need not reach the undoped GaN layer 4, provided it has the depth that reaches the p-type GaN layer 5. Also, the drain electrode 21 illustrated in FIG. 5 is provided in contact with the n-type GaN region 23, but it may be formed so as to contact both the undoped AlGaN layer 7 on the peripheral edge portion of the trench 22 and the n-type GaN region 23.

The nitride semiconductor device 350 according to the variation can maintain low on-resistance and high breakdown voltage and improved controllability of threshold voltage, by doping the n-type GaN layer 6 with n-type impurities. Also by connecting the p-type GaN layer 5 and the source electrode 15 via the p-type GaN region 19, it is possible to fix the potential of the p-type GaN layer 5, so it is possible to stabilize transistor switching operations.

In addition, it is possible to ensure the breakdown voltage between the gate and the drain by the pn junction formed between the n-type GaN region 23 provided directly below the drain electrode 21 and the p-type GaN layer 5. In other words, in the p-type GaN layer 5 and the n-type GaN layer 6 between the gate and drain, the potential distribution is virtually uniform; and by making the sheet carrier concentration of the p-type GaN layer 5 and the sheet carrier concentration of the n-type GaN layer 6 equal, it is possible to obtain a greater effect of breakdown voltage improvement.

The invention has been described with reference to the first through third embodiments of the invention, but the invention is not limited to these embodiments. The design modifications, materials modifications and the like made by a person skilled in the art based on the technological level at the time of the application, and other embodiments using the same technological idea as the invention are to be included in the scope of the invention.

Note that, in the specification, "nitride semiconductor" includes $B_x In_y Al_z Ga_{(1-x-y-z)} N$ (where $0 \leq x \leq 1$, $0 \leq y \leq 1$, $0 \leq z \leq 1$, and $0 \leq x+y+z \leq 1$) group compound semiconductors, and furthermore includes mixed crystals containing phosphorus (P) and/or arsenic (As) in addition to nitrogen (N) as group V elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor device comprising:
  a first semiconductor layer made of a nitride semiconductor of a first conductivity type;
  a second semiconductor layer provided on the first semiconductor layer, the second semiconductor layer being made of a nitride semiconductor of a second conductivity type;
  a third semiconductor layer provided on the second semiconductor layer, the third semiconductor layer being made of a nitride semiconductor with a forbidden band width wider than a forbidden band width of the second semiconductor layer;
  a first electrode electrically connected to the second semiconductor layer;
  a second electrode physically separated from the first electrode and electrically connected to the second semiconductor layer; and
  a control electrode provided between the first electrode and the second electrode, one end of the control electrode being disposed in the first semiconductor layer with an insulating film between the one end of the control electrode and the first semiconductor layer, the insulating film being provided in the first semiconductor layer, the second semiconductor layer, and the third semiconductor layer, and the other end of the control electrode being disposed above a level of an interface between the first semiconductor layer and the second semiconductor layer.

2. The device according to claim 1, wherein a distance between the first electrode and the control electrode is less than a distance between the second electrode and the control electrode.

3. The device according to claim 1, wherein the other end of the control electrode is disposed above the third semiconductor layer.

4. The device according to claim 1, wherein the third semiconductor layer includes a plurality of layers having mutually different compositions, and
  one of the layers is in contact with the second semiconductor layer, and has a forbidden band width wider than the forbidden band width of the second semiconductor layer.

5. The device according to claim 1, wherein the third semiconductor layer includes an AlGaN layer, and
  the AlGaN layer is in contact with the second semiconductor layer including GaN.

6. The device according to claim 1, wherein the third semiconductor layer includes an AlN layer, and
  the AlN layer is in contact with the second semiconductor layer including GaN.

7. The device according to claim 1, wherein the second semiconductor layer includes:
  a fourth semiconductor layer doped with impurities of the second conductivity type, and
  a fifth semiconductor layer that is in contact with the third semiconductor layer and that has a concentration of impurities of the second conductivity type lower than that of the fourth semiconductor layer.

8. The device according to claim 7, wherein the compositions of the fourth semiconductor layer and the fifth semiconductor layer are different.

9. The device according to claim 7, wherein the fourth semiconductor layer includes AlGaN, and the fifth semiconductor layer includes GaN.

10. The device according to claim 1, wherein the first semiconductor layer includes an AlGaN layer and a GaN layer.

11. The device according to claim 1, wherein the portion of the first electrode extends through the third semiconductor layer and the second semiconductor layer.

12. The device according to claim 10, wherein the first electrode includes a first ohmic electrode and a second ohmic electrode, and the first ohmic electrode is in contact with the first semiconductor layer, and the second ohmic electrode is in contact with the third semiconductor layer.

13. The device according to claim 1, wherein the insulating film includes a silicon nitride film.

14. The device according to claim 1, further comprising:
a substrate provided on a side of the first semiconductor layer that is opposite to the second semiconductor layer; and
a sixth semiconductor layer provided between the substrate and the first semiconductor layer, the sixth semiconductor layer having a higher electrical resistance than the first semiconductor layer and the second semiconductor layer.

15. The device according to claim 1, wherein the first semiconductor layer has a sheet carrier concentration that is almost same as a sheet carrier concentration of the second semiconductor layer.

16. The device according to claim 1, wherein a charge amount of the first semiconductor layer is in balance with a charge amount of the second semiconductor layer.

17. The device according to claim 1, further comprising a semiconductor region of the first conductivity type, provided directly below the first electrode and extending through the third semiconductor layer and the second semiconductor layer to reach the first semiconductor layer.

18. The device according to claim 8, wherein a carrier concentration of the semiconductor region is higher than a carrier concentration of the first semiconductor layer.

19. The device according to claim 8, wherein
the first electrode includes a first ohmic electrode and a second ohmic electrode, and
the first ohmic electrode is in contact with the semiconductor region, and the second ohmic electrode is in contact with the third semiconductor layer.

20. The device according to claim 1, further comprising a semiconductor region of the second conductivity type, provided directly below the second electrode and extending through the third semiconductor layer and the second semiconductor layer to reach the first semiconductor layer.

* * * * *